(12) United States Patent
Auguet et al.

(10) Patent No.: US 9,132,734 B2
(45) Date of Patent: Sep. 15, 2015

(54) CONNECTION DEVICE COMPRISING A CONTROL UNIT, BATTERY CASE COMPRISING SUCH A CONNECTION DEVICE AND METHOD FOR CONTROLLING SUCH A BATTERY CASE

(75) Inventors: Thierry Auguet, Clermont-Ferrand Cedex (FR); Pierre-Alain Magne, Clermont-Ferrand Cedex (FR); Olivier Joye, Clermont-Ferrand Cedex (FR)

(73) Assignees: COMPAGNIE GENERALE DES ETABLISSEMENTS MICHELIN, Clermont-Ferrand (FR); Michelin Recherche et Technique S.A., Granges-Paccot (CH)

( * ) Notice: Subject to any disclaimer, the term of this patent is extended or adjusted under 35 U.S.C. 154(b) by 154 days.

(21) Appl. No.: 13/814,175

(22) PCT Filed: Aug. 1, 2011

(86) PCT No.: PCT/EP2011/063219
§ 371 (c)(1),
(2), (4) Date: May 9, 2013

(87) PCT Pub. No.: WO2012/016950
PCT Pub. Date: Feb. 9, 2012

(65) Prior Publication Data
US 2013/0229742 A1    Sep. 5, 2013

(30) Foreign Application Priority Data

Aug. 2, 2010 (FR) ........................... 10 56363

(51) Int. Cl.
*H02H 5/04* (2006.01)
*B60L 3/04* (2006.01)
(Continued)

(52) U.S. Cl.
CPC ............... *B60L 3/04* (2013.01); *B60L 3/0046* (2013.01); *B60L 3/0069* (2013.01); *B60L 3/12* (2013.01); *B60L 11/1877* (2013.01);
(Continued)

(58) Field of Classification Search
USPC .................................. 361/23, 49, 91.5, 114
See application file for complete search history.

(56) References Cited

U.S. PATENT DOCUMENTS

| | | | |
|---|---|---|---|
| 6,381,110 B1 | 4/2002 | Nagashima et al. | |
| 7,057,306 B2 * | 6/2006 | Belschner et al. | 307/9.1 |

(Continued)

FOREIGN PATENT DOCUMENTS

| | | |
|---|---|---|
| CN | 1825676 | 8/2006 |
| CN | 101499676 | 8/2009 |

(Continued)

*Primary Examiner* — Danny Nguyen
(74) *Attorney, Agent, or Firm* — Cozen O'Connor (57) ABSTRACT

A device for connection 3 of a battery 2 to an electric or hybrid motor vehicle, comprising at least one input 3a capable of being connected to a first terminal 2a of the battery and at least one output 3b capable of being connected to a first terminal of an electrical circuit of the vehicle. The device 3 also comprises: a device for measuring the voltage 7 between the first terminal 2a of the battery and a reference potential 15, and a control unit 14 capable of receiving the voltage values measured by the voltage-measuring device 7, capable of determining an insulation resistance between the first terminal 2a of the battery and the reference potential 15, and capable of connecting or keeping connected the first terminal 2a of the battery and the first terminal of the electrical circuit if said insulation resistance is greater than a determined threshold.

11 Claims, 5 Drawing Sheets

(51) Int. Cl.
    *B60L 3/00*         (2006.01)
    *B60L 11/18*       (2006.01)
    *G01R 31/02*      (2006.01)
    *G01R 31/12*      (2006.01)
    *B60L 3/12*        (2006.01)

(52) U.S. Cl.
    CPC .......... *B60L 11/1879* (2013.01); *G01R 31/025* (2013.01); *G01R 31/1227* (2013.01); *B60L 2210/10* (2013.01); *B60L 2240/545* (2013.01); *B60L 2240/547* (2013.01); *B60L 2240/549* (2013.01); *B60L 2250/10* (2013.01); *Y02T 10/705* (2013.01); *Y02T 10/7005* (2013.01)

(56) References Cited

U.S. PATENT DOCUMENTS

| | | |
|---|---|---|
| 2005/0264264 A1 | 12/2005 | Yano et al. |
| 2007/0008666 A1 | 1/2007 | Morita et al. |
| 2007/0013382 A1 | 1/2007 | Hinz et al. |
| 2009/0002903 A1* | 1/2009 | Uchida ..................... 361/49 |
| 2009/0091868 A1 | 4/2009 | Trenchs et al. |
| 2010/0246081 A1* | 9/2010 | Yano et al. ................ 361/91.5 |

FOREIGN PATENT DOCUMENTS

| | | |
|---|---|---|
| EP | 0 639 844 | 2/1995 |
| JP | 11-32401 | 2/1999 |

\* cited by examiner

FIG.5

CONNECTION DEVICE COMPRISING A CONTROL UNIT, BATTERY CASE COMPRISING SUCH A CONNECTION DEVICE AND METHOD FOR CONTROLLING SUCH A BATTERY CASE

RELATED APPLICATIONS

This is a U.S. National Phase Application under 35 USC 371 of International Application PCT/EP2011/063219 filed on Aug. 1, 2011.

This application claims the priority of French application Ser. No. 10/56363 filed Aug. 2, 2010, the entire content of which is hereby incorporated by reference.

FIELD OF THE INVENTION

The present invention relates to the domain of electric or hybrid motor vehicles, requiring the use of electric batteries. In particular, the present invention relates to battery cases.

The term "electric motor vehicle" is understood to mean a vehicle as defined in Regulation No. 100 of the United Nations concerning the approval of battery electric vehicles.

More particularly, the present invention relates to a battery case comprising a battery formed from one or more accumulator sets. Each accumulator set comprises a plurality of superimposed electrical energy accumulator elements and at least one connection means to electrically connect the accumulator elements. The battery constitutes the source of electrical energy used for the motorization of the electric or hybrid vehicle.

BACKGROUND OF THE INVENTION

A consistent electrical energy reserve is required in order to provide the vehicle with increased autonomy. This leads to the use of a battery which is relatively bulky, relatively heavy and capable of presenting risks from an electrical point of view.

It is known for a fuse, referred to as a "passive" fuse, to be used to isolate an electrical element if the latter delivers an electrical current greater than a value determined by the characteristics of the fuse. The fuse then acts as a circuit-breaker. However, the fuse responds only to an electrical current and does not allow the electrical element to be isolated in the event of other malfunctions on the electrical circuit.

It is also possible to provide controlled switches to isolate an electrical element. The controlled switch allows the electrical element in a circuit to be disconnected, but also to be reconnected. However, the controlled switch requires a control unit to control the switch, the control unit having to be capable of detecting a malfunction of the electrical element.

The documents FR2927200, WO2008032945, WO2006085730 and WO2008032945 relate to devices comprising battery management means, notably allowing the charge/discharge cycles to be improved and the battery operating parameters to be monitored. However, such means are not always sufficient to detect a malfunction and its origin in the battery.

SUMMARY OF THE INVENTION

One object of the present invention is to improve, in a general manner, the safety of electric or hybrid propulsion vehicles and the safety of persons using the vehicles or having to carry out work on the batteries or on the vehicles.

In particular, an object of the present invention is to provide a connection device, a battery case and a method for controlling such a battery case, allowing the operation of the battery to be monitored, notably allowing malfunctions or abnormal electrical conditions to be detected.

For this purpose, according to one embodiment, a device is proposed for connecting a battery to an electric or hybrid motor vehicle, comprising at least one input capable of being connected to a first terminal of the battery, and at least one output capable of being connected to a first terminal of an electrical circuit of the vehicle. The device also comprises:

a device for measuring the voltage between the first terminal of the battery and a reference potential, and a control unit capable of receiving the voltage values measured by the voltage-measuring device, capable of determining an insulation resistance between the first terminal of the battery and the reference potential, and capable of connecting or keeping connected the first terminal of the battery and the first terminal of the electrical circuit if said insulation resistance is greater than a determined threshold. The determined threshold may be greater than or equal to 500 ohm per volt, or possibly greater than or equal to 100 ohm per volt.

Thus, the connection device allows the potential difference between a terminal of the battery and a reference potential to be checked. The reference potential may, for example, be the potential of the battery case or the potential of the vehicle chassis (electrical ground of the vehicle). A poor electrical insulation of a terminal of the battery in relation to the chassis of the vehicle or in relation to the battery case can thus be detected. Moreover, when the vehicle is in operation, i.e. when the battery is connected to the electrical circuit of the vehicle, a contact can be detected between a point of the electrical circuit fed by the battery and the chassis of the vehicle.

The voltage-measuring device preferably comprises:

a measurement input, a resistor and a switch fitted in series between the measurement input and the reference potential, the switch being controlled by the control unit, and a voltmeter fitted in parallel with the resistor and the switch between the measurement input and the reference potential.

The connection device may also comprise a circuit-breaker, preferably a switch, fitted in series between the input and the output of the connection device, the circuit-breaker being controlled by the control unit and allowing the first terminal of the battery to be connected to the first terminal of the electrical circuit. The circuit-breaker simply enables the connection or disconnection of the first terminal of the battery to the first terminal of the electrical circuit, either when the vehicle is stopped or when an abnormal electrical condition is detected, for example an overcurrent, an undervoltage or an overvoltage.

More generally, the control unit may be capable of receiving battery voltage, current and/or temperature values, and may be capable of connecting or keeping connected the first terminal of the battery and the first terminal of the electrical circuit when a value of the current flowing in the first terminal of the battery is lower than a determined threshold (absence of overcurrent), and/or when a voltage value is greater than a determined threshold (absence of undervoltage), and/or when a voltage value is lower than a determined threshold (absence of overvoltage), and/or when a battery temperature value is lower than a determined threshold.

The connection device may also comprise a fuse fitted in series between the input and the output of the connection device.

The connection device may comprise an electrical circuit disconnection device fitted in series between the input and the output of the connection device, the electrical circuit disconnection device being controlled by the control unit. In one preferred embodiment, the disconnection device comprises a pyrotechnic igniter connected to control terminals, the electrical opening of the disconnection device being controlled by an electrical control signal applied to said control terminals.

The opening of the electrical circuit through ignition of the pyrotechnic charge is thus directly obtained. To do this, it suffices to apply a suitable control signal, for example a control voltage, to the terminals of the pyrotechnic charge. The control signal is preferably produced by electrical means in order to ensure an ultra-rapid triggering control. The disconnection device notably allows the electrical contact between the battery and the electrical circuits of the vehicle to be interrupted quickly and reliably when an abnormal condition likely to damage the equipment is detected.

In one advantageous embodiment, the electrical circuit disconnection device may comprise a contact component in the form of a mobile element sliding inside the poles between which it must make or break the electrical connection. In the closed position of the electrical contact, the contact component provides a bridge and a good electrical contact between poles and, in the open position of the circuit, the place initially occupied by the contact component is taken by an isolating push-button. The disconnection device may thus comprise a first and a second electrical pole connected between the output of the battery and the output of the battery case, the disconnection device being intended to interrupt the electrical continuity between said first and second electrical poles.

It is known that, owing to the existing inductances on the electrical circuit to be protected and due to the particularly high current intensities, an electrical arc will appear between the pole and the contact component at the time when the contact component will no longer be in contact with the first pole. This electrical arc causes the ionization of the atmosphere inside the disconnection device and ensures that the electrical continuity is maintained. However, with the previously described disconnection device, the push-button which pushes back the contact component is itself made from an electrically non-conducting material resistant to electrical arcs.

The control unit is capable, notably through voltage measurements, current measurements and/or temperature measurements, of detecting an electrical contact between the battery and the reference potential and/or an abnormal condition, and is capable of isolating the battery by controlling switches. In particular, in the event of an abnormal electrical condition, the control unit is capable of warning the driver of the detection of such an abnormal condition, by way of an audible and/or visual message, and is capable of preventing the vehicle from restarting when the latter has been stopped after the warning message. However, in the event of abnormal electrical conditions such as overvoltages which may cause damage to the equipment (for example to the battery elements or electrical components), the control unit can open the switches or, if the latter are damaged and remain closed, can apply the electrical control signal to the disconnection device in order to interrupt the current supplied by the battery in a quick and reliable manner.

The connection device may also comprise a manually controlled isolator fitted in series between the input of the connection device and the input of the measurement device. In one preferred embodiment, the manually controlled isolator comprises a base fitted with spaced electrical contact means and adapted to be connected to a detachable component provided with a disconnection bar in such a way that, after connection, the disconnection bar of the detachable component connects the electrical contact means of the base.

Thus, as the battery may contain a substantial electrical charge, it is possible to isolate the battery simply by separating the detachable component from the base, in such a way that work carried out on the battery case, in particular during its insertion or removal, or work carried out on the electrical components of the vehicle can be made safe.

According to one embodiment, the connection device includes a second input capable of being connected to a second terminal of the battery, a second output capable of being connected to a second terminal of electrical circuit, and a second device for measuring the voltage between the second terminal of the battery and a reference potential. The control unit is capable of receiving the voltage values measured by the second voltage-measuring device, capable of determining an insulation resistance between the second terminal of the battery and the reference potential, and capable of connecting or keeping connected the second terminal of the battery and the second terminal of the electrical circuit when said insulation resistance is greater than the determined threshold. The insulation of the two terminals of the battery in relation to the reference potential can thus be measured at the same time.

The connection device may also comprise a circuit-breaker and/or an electrical circuit disconnection device fitted in series between the second input and the second output of the connection device.

An aspect of the invention relates to a battery case for an electric or hybrid vehicle comprising a battery and a connection device as previously described.

Another aspect of the invention relates to a method for controlling a battery case for an electric or hybrid motor vehicle, comprising a battery containing a first terminal capable of being connected to a first terminal of an electrical circuit. According to the method, the voltage between a reference potential and the first terminal of the battery is measured, an insulation resistance between the first terminal of the battery and the reference potential is determined, and the first terminal of the battery and the first terminal of the electrical circuits are connected or kept connected when said insulation resistance is greater than a determined threshold. The first terminal of the battery and the first terminal of the electrical circuit can also be connected or kept connected if the voltage is greater than a determined threshold and/or less than a determined threshold. The first terminal of the battery and the first terminal of the electrical circuit can also be kept connected when the current flowing in the first terminal of the battery and the first terminal of the electrical circuit is less than a determined threshold. The first terminal of the battery and the first terminal of the electrical circuit can also be connected or kept connected when the temperature of the battery is less than a determined threshold.

The voltage between the first terminal of the battery and the reference potential, and/or the current flowing in the first terminal of the battery, and/or the temperature of the battery are preferably measured when the vehicle starts and/or at regular intervals during the operation of the vehicle, for example between 1 second and 1 minute.

BRIEF DESCRIPTION OF THE DRAWINGS

The present invention will be more readily understood from a reading of the detailed description of an embodiment given as a non-limiting example and illustrated by the attached drawings, in which.

DETAILED DESCRIPTION OF THE DRAWINGS

Figure 1:
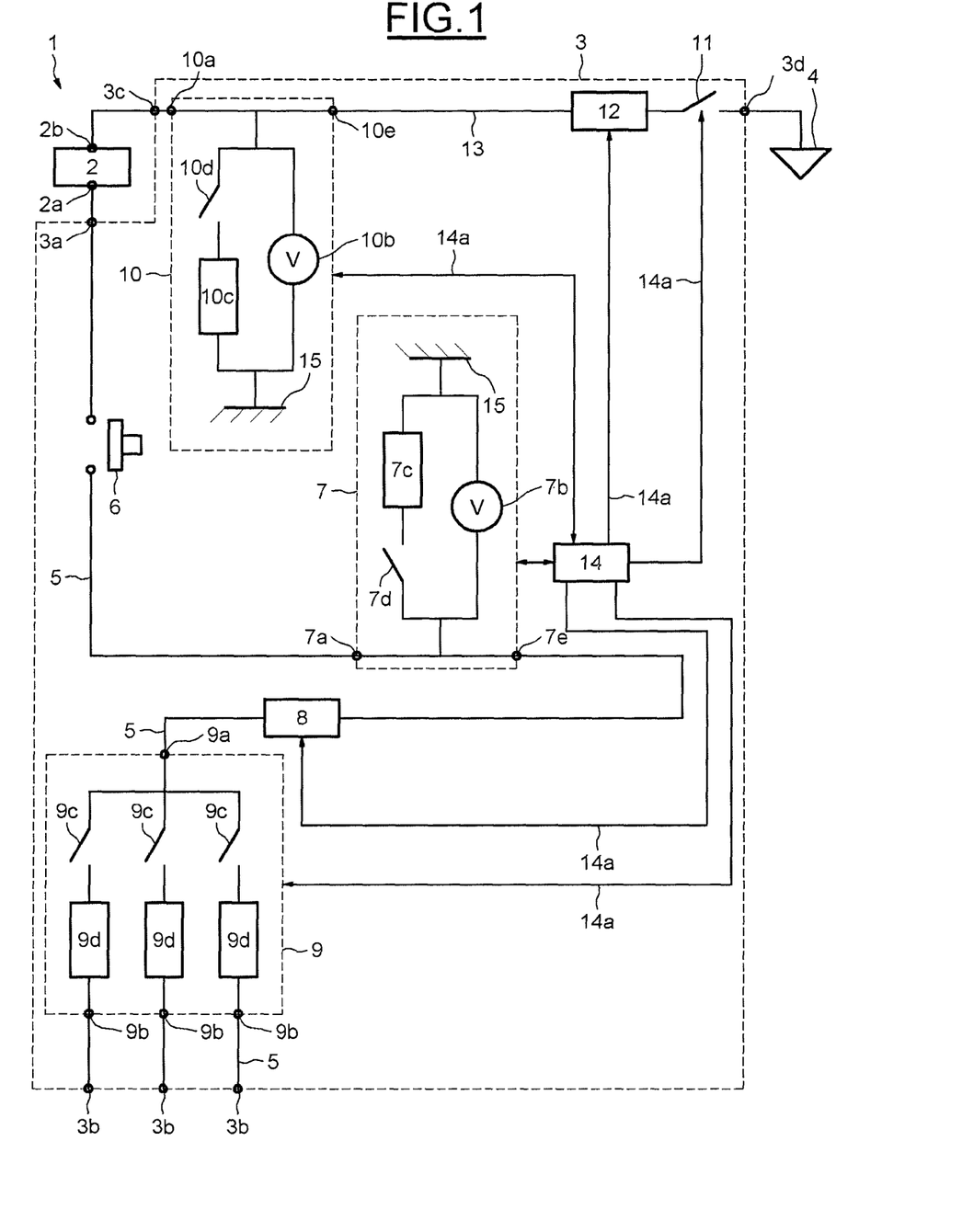
FIG. 1 shows schematically a battery with a connection device.

FIG. 1 shows schematically the main elements of a battery case 1 comprising a battery 2 and a connection device 3. The battery 2 comprises a first terminal 2a and a second terminal 2b, and also a plurality of accumulator blocks (not shown). The accumulator blocks are provided, for example, in the form of insulating housings containing electrical energy accumulator sets, and are fitted in series between the first terminal 2a and the second terminal 2b of the battery. The first terminal 2a may, for example, be the positive terminal of the battery and the second terminal 2b may be the negative terminal of the battery 2.

The battery 2 is connected via the connection device 3 to one or more electrical circuits of the motor vehicle, for example the electrical propulsion circuit, the electrical shock absorber circuit, the electrical air-conditioning circuit, etc. In particular, the negative terminal 2b of the battery may be connected to a negative terminal 4 common to the electrical circuits, and the positive terminal 2a of the battery may be connected individually to each electrical circuit, to supply the electrical energy. The positive terminal 2a and the negative terminal 2b are separate from the vehicle chassis, of which the potential is the reference potential. The battery and the electrical circuits are therefore electrically isolated from the vehicle chassis.

The positive terminal 2a of the battery is connected to a first input 3a of the connection device 3. The connection device 3 also comprises outputs 3b, each capable of feeding one of the electrical circuits of the motor vehicle. The connection device 3 also comprises a manually controlled isolator 6, a first measurement device 7, a disconnection device 8 and a relay device 9 fitted successively in series via connections 5 between the input 3a and the outputs 3b.

The negative terminal 2b of the battery is connected to a second input 3c of the connection device 3. The connection device 3 also comprises a second output 3d connected to the negative terminal 4 common to all of the electrical circuits fed by the battery 2. A second measurement device 10, a circuit-breaker 11, for example a controllable switch, and possibly a second disconnection device 12 are fitted successively in series via connections 13 between the input 3c and the output 3d.

The connection device 2 also comprises a control unit 14, connected via connections 14a to the measurement devices 7 and 10, to the disconnection device 8, to the relay device 9 and to the circuit-breaker 11. The connections 14a can be established by electrical wires allowing the exchange of signals with the control unit 14. In particular, the control unit 14 receives information from the measurement device(s) 7 and 10, and sends control signals to the measurement devices 7 and 10, to the disconnection device 8, to the relay device 9 and to the circuit-breaker 11.

The relay device 9 comprises an input 9a connected via a connection 5 to the output of the electrical circuit disconnection device 8, and outputs 9b connected via connections 5 to the outputs 3b of the connection device 3. A circuit-breaker, implemented, for example, in the form of controlled switches 9c, and a fuse 9d, fitted in series between the input 9a and said output 9b, are associated with each output 9b. Each switch 9c is controlled by the control unit 14 and controls the electrical power supply of the electrical circuit connected to the corresponding output 3b. The fuse 9d allows the electrical power supply contact of said electrical circuit to be opened if the intensity of the current flowing in the electrical circuit is greater than a threshold determined by the physical properties of the fuse 9d. Thus, the control of the circuit-breakers 9c by the control unit allows the different components of the vehicle which are fed by the battery 2, for example the electrical air-conditioning circuit, the electrical propulsion circuit, etc., to be selected.

The control of the disconnection device 8, and possibly the disconnection device 12, by the control unit 14 interrupts the electrical contact between the battery 2 and the outputs 3b of the connection device 3. This control may follow the detection by the control unit 14 of a major malfunction requiring the prompt interruption of the electrical contact and the intervention of a professional. The battery can then be reconnected to the outputs 3b only through replacement, at least in part, of the disconnection device 8, which can only be carried out by said professional.

The manually controlled isolator 6 allows the battery to be disconnected manually from the vehicle, notably when work is carried out on the vehicle or during a step of inserting/removing the battery.

The first and second measurement devices 7 and 10 may be identical. They may each comprise a measurement input 7a, 10a, a measurement means, for example a voltmeter 7b, 10b, fitted between a reference potential 15 and the measurement input 7a, 10a. The measurement devices 7 and 10 may also each comprise a resistor 7c, 10c and a controllable switch 7d, 10d, fitted in series between the measurement input 7a, 10a and the reference potential 15. The resistor 7c, 10c and the switch 7d, 10d on the one hand and the voltmeter 7b, 10b on the other hand are therefore fitted in parallel between the measurement input 7a, 10a and the reference potential 15 of each measurement device 7, 10. The reference potential is, for example, that of the vehicle, i.e. that of the vehicle chassis, or that of the battery case. The switches 7d, 10d are controlled by the control unit 14, via the connection 14a, and allow the known resistor 7c, 10c to be introduced between each terminal of the battery and the reference potential 15.

Finally, the measurement devices 7, 10 each comprise an output 7e, 10e connected to the measurement input 7a, 10a.

The measurement of the insulation resistance is controlled by the control unit 14 and is carried out according to the following steps.

In a first and a second step, the voltmeters 7b, 10b, with the switches 7d, 10d open, measure the voltage $V_7$, $V_{10}$ between each terminal of the battery and the reference potential 15. Then, in a third step, the control unit 14 compares the voltages $V_7$ and $V_{10}$, and considers only the higher voltage.

Thus, if the voltage $V_7$ is higher than the voltage $V_{10}$, the control unit 14 controls the closure of the switch 7d and the voltmeter again measures the voltage $V'_7$ between the terminal 2a of the battery and the reference potential 15, in a fourth step. The voltage measurements $V_7$, $V'_7$ carried out by the voltmeter 7b are used by the control unit 14, in a final step, to calculate the insulation resistance $R_{i7}$, between the terminal 2a of the battery and the reference potential. In particular, the insulation resistance $R_{i7}$ (in ohms per volt) can be calculated on the basis of the following formula:

$$R_{i7} = R_7 * \left( \frac{1}{V'_7} - \frac{1}{V_7} \right)$$

where: $R_7$ is the value of the resistor 7c

Conversely, if the voltage $V_{10}$ is higher than the voltage $V_7$, the control unit 14 controls the closure of this switch 10d, and the voltmeter again measures the voltage $V'_{10}$ between the terminal 2b of the battery and the reference potential 15, in a fourth step. The voltage measurements $V_{10}$, $V'_{10}$ carried out by the voltmeter 10b are used by the control unit 14 to calculate, in a final step, the insulation resistance $R_{i10}$ between the terminal 2b of the battery and the reference potential. In particular, the insulation resistance $R_{i10}$ (in ohms per volt) can be calculated on the basis of the following formula:

$$R_{i10} = R_{10} * \left( \frac{1}{V'_{10}} - \frac{1}{V_{10}} \right)$$

where: $R_{10}$ is the value of the resistor 10c.

When the vehicle starts up, the switches 9c and 11 are open (i.e. the battery 2 is disconnected from the electrical circuits of the vehicle) as when the vehicle is switched off. The control unit 14 then measures the insulation resistance of the battery as previously described.

If the value $R_{i7}$ or $R_{i10}$ is lower than a determined threshold, the insulation between a terminal of the battery and the reference potential is not sufficient: there is a risk of malfunction and the switches 9c and 11 are then kept open.

If the values $R_{i7}$ and $R_{i10}$ are greater than the determined threshold, the control unit 14 closes the switch 11 in such a way as to connect the negative terminal 2b of the battery to the common negative terminal 4, then measures the insulation resistance of the battery once more as previously described. If the value $R_{i10}$ is lower than a determined threshold, the insulation between the common negative terminal 4 of the vehicle and the reference potential is not sufficient: the switch 11 is then open and the battery is not connected to the electrical circuits of the vehicle.

If the values $R_{i7}$ and $R_{i10}$ are greater than the determined threshold, the control unit 14 opens the switch 11, closes the switches 9c in such a way as to connect the positive terminal 2a of the battery to the electrical circuits of the vehicle, then measures the insulation resistance of the battery once more as previously described. If the value $R_{i7}$ is lower than a determined threshold, the insulation between the positive terminal of the electrical circuits of the vehicle and the reference potential is not sufficient: the switches 9c are then open and the battery is not connected to the electrical circuits of the vehicle.

If the values $R_{i7}$ and $R_{i10}$ are greater than the determined threshold, the control unit 14 closes the switch 11 as well as the switches 9c. The electrical circuits of the vehicle are then fed by the battery, and the vehicle can start up. Once the vehicle has started up, the control unit 14 again measures the insulation resistance of the battery as previously described, with the switches 9c and 11 closed, at regular intervals, for example between 1 second and 1 minute. Such measures do not change the operation of the vehicle because the battery is still connected to the vehicle.

If the value $R_{i7}$ or $R_{i10}$ becomes less than a determined threshold during the operation of the vehicle, the control unit 14 can trigger a warning signal for the driver of the vehicle, or can prevent the vehicle from restarting if the latter is switched off.

The connection device 3 allows the insulation of each terminal of the battery in relation to the reference potential to be controlled. It is notably possible to detect a slow and regular lowering of the insulation of one of the terminals of the battery (for example through progressive wear of an electrical insulator) and to warn the user or possibly prevent the operation of the vehicle. It is also possible to detect an abrupt lowering of the insulation which may damage the equipment, and to interrupt quickly and in a reliable manner the electrical connection between the battery and electrical circuits of the vehicle using the disconnection device 8.

Thus, a battery case comprising a connection device 3 as described in FIG. 1 allows a regular control of the insulation of each terminal of the battery in relation to the chassis of the vehicle or the battery case. It is then possible to detect, on the one hand, possible malfunctions appearing slowly and, on the other hand, abrupt abnormal conditions which may damage the equipment.

The disconnection device 8 may advantageously be a pyrotechnic device such as, for example, the device described in patent application FR2869450 which can be referred to for more details. Such a disconnection device 8, shown in section in FIG. 2, has a generally cylindrical shape.

Figure 2:
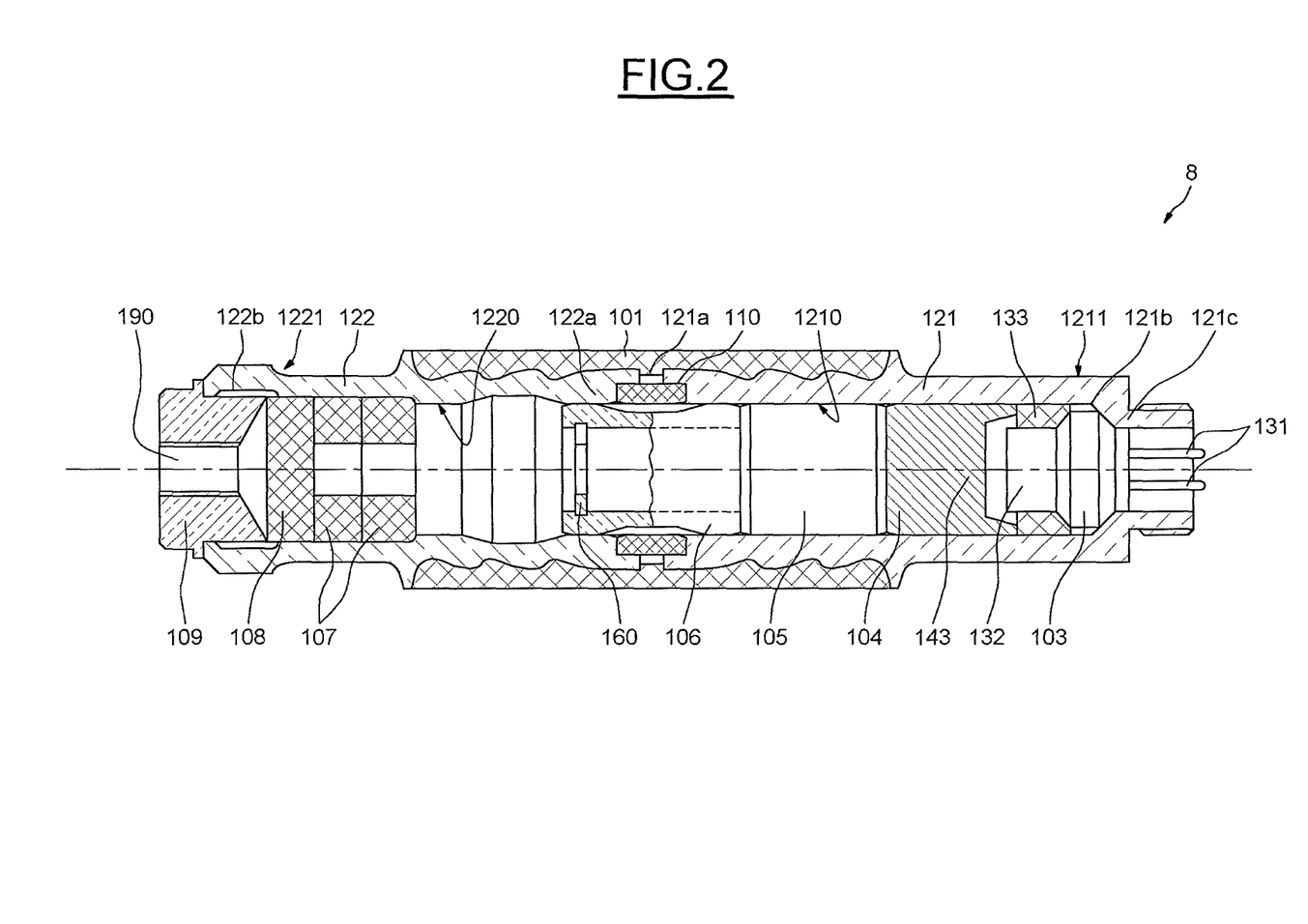
FIG. 2 is a general axial section of a disconnection device shown in the position in which the electrical circuit is closed.

A first sleeve comprises a first electrical pole 121, and a second sleeve comprises a second electrical pole 122. These poles are preferably made from copper and have a generally tubular shape. They are connected via a sheath 101 made from an electrically non-conducting material. The sheath 101 comprises, for example, a plurality of layers of resin-impregnated, woven glass-fibre fabric, surrounding the respective outer surfaces of the first and second poles 121, 122 by at least partially overlapping them. The edges of each of the poles 121 and 122 with regard to one another end in the form of a shoulder 121a and 122a respectively. The poles 121 and 122 are also positioned and kept in place by a ring 110, fitted between the two poles and made from an electrically non-conducting material resistant to electrical arcs. In this way, the poles 121 and 122 are centred by the ring 110 and aligned in relation to one another. The sheath 101 and the ring 110 mechanically connect the poles 121 and 122 to one another while keeping them electrically insulated from one another. It should be noted that, as a variant, the sheath 101 and the ring 110 can be made from a single piece.

The pole 121 has a cylindrical bore 1210 over practically its entire length. The pole 121 comprises, on one of its ends, opposite to the ring 110, a shoulder 121b having a tapered surface on the inner side. The pole 121 comprises a part 121c comprising an external thread in order to receive, for example, an electrical connection.

A pyrotechnic igniter 103 is inserted inside the pole 121 and is immobilized on the end of the latter against the tapered surface of the shoulder 121b by means of an adjusted tightened ring 133. The igniter 103 comprises terminals 131 accessible via the outside of the disconnection device and allowing the connection of the pyrotechnic igniter. On the side opposite to these terminals 131, the pyrotechnic igniter 103 comprises a housing 132 receiving the explosive charge. Pyrotechnic igniters designed to trigger the operation of airbags or seatbelt pre-tensioners for motor vehicles, for example, can be used as the pyrotechnic igniter 103.

The pole 122 has a thread 1220 over approximately half of its axial length. The latter comprises two cylindrical spans with the same diameter as the thread 1210. A cylindrical span with a greater diameter is provided between these two cylindrical spans. The pole 122 then forms a receptacle whose internal, cylindrical wall is machined to a diameter slightly greater than that of the two cylindrical spans described above.

The pole 122 has a threaded area 122b on an end opposite to the ring 110. A cap 109, fitted by screwing to the end of the pole 122, closes said receptacle. The cap 109 comprises a threaded hole 190 which can receive an electrical connection screw. Each of the poles 121 and 122 also has an outer span 1211 and 1221 respectively, allowing an electrical conductor to be connected to each of the poles 121 and 122.

In the example shown, the disconnection device comprises a propulsion piston 104 made as a single block from material resistant to the heat released by the explosion of the pyrotechnic charge. The piston 104 comprises a skirt disposed in such a way as to be oriented on the side of the pyrotechnic igniter. In this way, a small inner chamber 143 exists between the piston 104 and the pyrotechnic igniter 103. During the explosion, the generated pressure pushes the lips of the skirt against the thread 1210, thereby improving the seal and preventing the propagation of the gases and burnt particles towards the left side of FIG. 2. The skirt of the piston 104 can preferably undergo a certain plastic deformation in order to complete the seal. Certain plastic materials are totally suitable for the design of the piston 104, such as, for example an infusible polyimide available from DuPont de Nemours under the name of "VESPEL SPI".

A push-button 105 is fitted adjacent to the piston 104. The push-button 105 may be either solid or hollow. The push-button 105 is preferably made from ceramic or an electrically non-conducting material resistant to flames and to an electrical arc.

A contact component 106, made from an electrically conducting material, is fitted adjacent to the push-button 105, opposite the piston 104. The contact component 106 is preferably made from copper. The contact component 106 comprises a piece which is independent here from the electrical poles 121 and 122. In the example shown, the contact component 106 has the shape of an essentially tubular piece, comprising two peripheral ribs to make contact with one of the poles 121 and 122 when the contact component 106 is in the position shown in FIG. 2 where it closes the electrical contact.

The outer surfaces of the protuberances are pressed against the inner surfaces of the poles, as shown in FIG. 2, through an elastic effect. The contact component 106 comprises slots allowing the deformation of the outer surface of the contact component 106. In FIG. 2, it can be seen that the contact component 106 comprises an inner radial groove (one groove on each side), inside which a circlip 160 is fitted which exerts a radial force on the contact component. An excellent electrical contact is thus achieved, with the lowest possible contact resistance between the poles and the contact component 106.

The contact component 106 is liable to slide within the threads 1210 and 1220, its shape and external dimensions being adjusted through elastic deformation to the internal diameters of said threads.

Finally, damping washers 107 and 108, preferably made from an elastomeric material having high damping properties, are inserted at the end of the disconnection device. The washers 107 and 108 are inserted in front of the cap 109 from which they may derive support.

Thus, in this advantageous alternative embodiment, the first sleeve 1210 contains a propulsion piston 104 interposed between the push-button 105 and the pyrotechnic igniter 103; the propulsion piston 104 is fitted so that it slides within said first sleeve 210, the propulsion piston being capable of being set in motion through ignition of the pyrotechnic charge to push back the push-button 105.

Each of the sleeves 1210 and 1220 forms an inner thread, inside which the contact component 106, the push-button 105 and the propulsion piston 104 can simultaneously slide. The adjustment of the contact component 106 in relation to the poles 121 and 122 is lightly tightening, in such a way that the propulsion piston 104, the push-button 105 and the contact component 106 naturally retain the longitudinal position imposed during the fitting. When fitted, the contact component 106, the push-button 105 and the piston 104 are installed one against the other, in close contact with one another.

Figure 3:
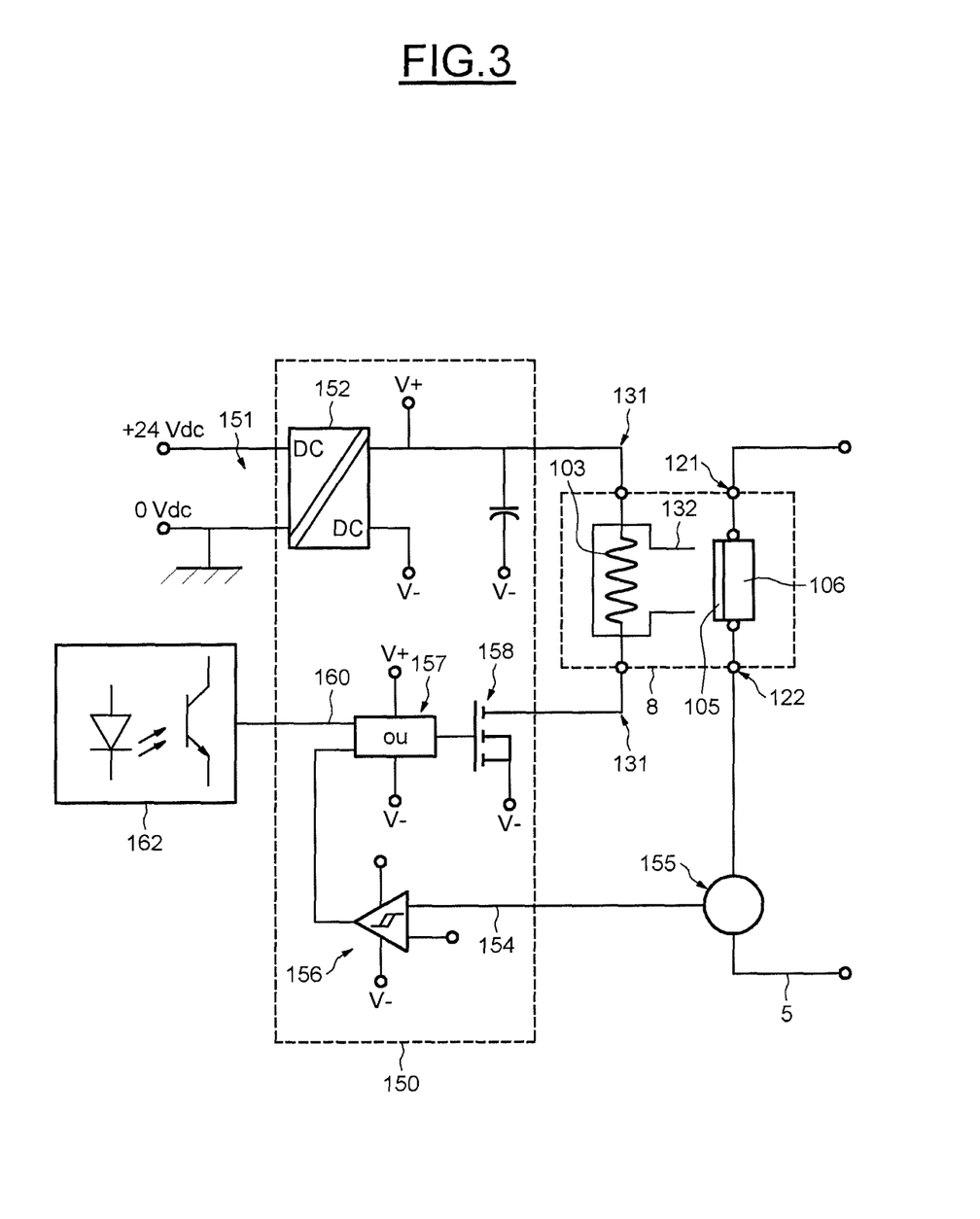
FIG. 3 shows a control circuit of a disconnection device.

FIG. 3 shows an electrical line 5, connected to the electrical poles, which comprise, for example, the two sleeves 121 and 122 shown in FIG. 2, of a disconnection device 8. A control circuit 150 is connected to the terminals 131 providing the connection to the pyrotechnic igniter 103. The circuit 150 receives a low-voltage power supply 152, and comprises a DC/DC galvanic isolation element 153 between the low-voltage power supply 152 and the control elements of the pyrotechnic charge. The circuit 150 may form part of the control unit 14 shown in FIG. 1.

The circuit 150 comprises a first control channel 154 responding to an excessively high intensity in the line 5. This first channel 154 comprises a current sensor 155 continuously measuring the current on the line 5. The sensor 155 is connected to a comparator 156, itself connected to an "or" logic gate 157. The output of the logic gate 157 is connected to a power transistor 158, for example a MOSFET, which, when it receives the appropriate signal from the logic gate 157, injects a control current into the terminals 131 of the pyrotechnic igniter 103. The pyrotechnic element is preferably deliberately overfed in order to accelerate the ignition of the charge, by 3 to times the nominal current for which it is dimensioned. The power transistor 158 is preferably connected to a capacitor storing the energy required to produce the control current.

The circuit 150 also comprises a second control channel 161 responding to other types of faults, such as a fault in a stack of accumulator elements. This second channel 161 comprises an optocoupler 162, connected to the other input of the logic gate 157.

It is important to note that, during the operation of the disconnection device 8, no galvanic isolation can be provided between the terminals 131 and the pole 121, hence a setting of the control circuit 150 to the same electrical potential as the pole 121. Similarly, following disconnection, it may occur, through simple electrical influence, that the poles 121 and 122 take or retain the same electrical potential which may be high. Thanks to the galvanic isolation provided by the DC/DC element 152 and/or by the optocoupler 162, the control of the disconnection device 8 can effectively be provided, while maintaining the galvanic isolation of the upstream electronic components providing the low-voltage power supply necessary for said command.

Thus, the disconnection device 8 is capable of very quickly interrupting an electrical current. The time that elapses between the start of the production of the control signal and the end of the disconnection of the electrical circuit is in the order of 300 to 400 microseconds.

Figure 4:
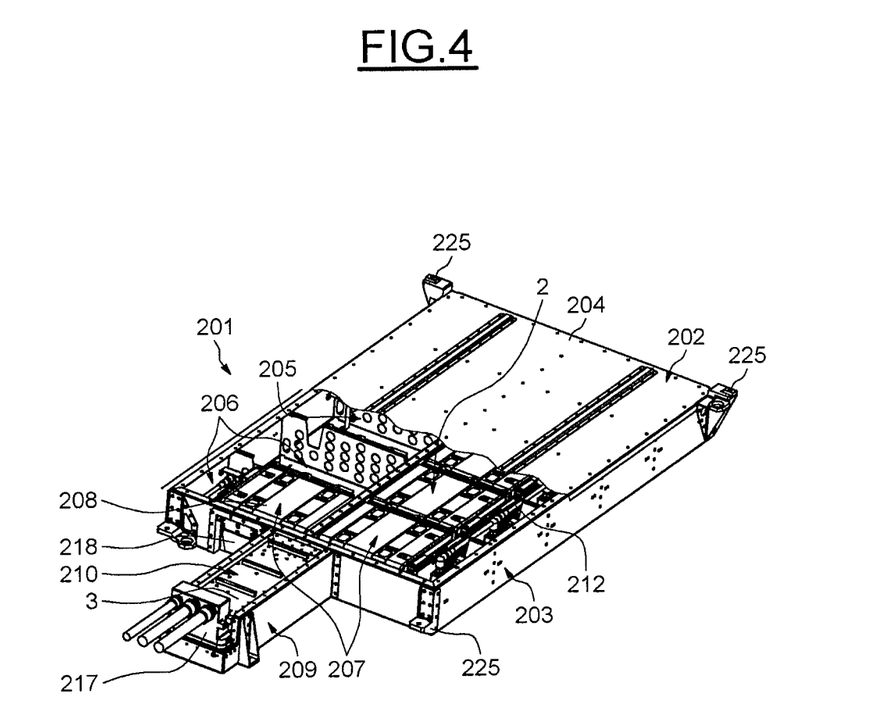
FIG. 4 shows an external perspective view of a battery case, partially open.

FIG. 4 shows a battery case 201, intended to be installed under the chassis of a vehicle in a removable manner. The case 201 comprises an external envelope 202 with a generally parallelepiped shape, made, for example, from metal, and comprising a support 203 in the shape of a rectangular bowl, in which a battery 2 is installed, a cover 204 being fitted onto a peripheral lip of the support.

A partitioning 205 which determines adjacent compartments 206 in which accumulator blocks 207 comprising insulating housings 208 which contain electrical energy accumulator sets constituting the battery 2 can be disposed is provided in the support 203.

In the example shown, the partitioning 205 determines two rows of five compartments 206, receiving in total ten accumulator blocks 207, leaving internal spaces for the passage of connection wires.

In this embodiment, the support 203 has a central prolongation 209 with a width smaller than that of the support 203, determining a secondary compartment 210 in which a connection device 3 is disposed, at least in part. Thus, the disconnection device 8, the electrical or electronic device 9 and the control unit 14 of the battery 2 are disposed in the compartment 210. In this embodiment, the battery case 201 therefore incorporates the connection device 3.

An electrical connector 217 can be connected to the outputs of the connection device 3, via the wall of the secondary compartment 210, for the electrical connections of the battery 2.

A hollow recess 218 (see FIG. 5), open laterally and downwards, below the support 203, is disposed in a lateral wall of the support 203, adjacent to the prolongation 209. A manually controlled isolator 6 comprising a base 220 fixed in the upper part of the hollow recess 218 and a detachable component 221 is installed in this hollow recess 218. The component 221 is thus accessible from the outside of the envelope 202, laterally and below the vehicle.

Figure 5:
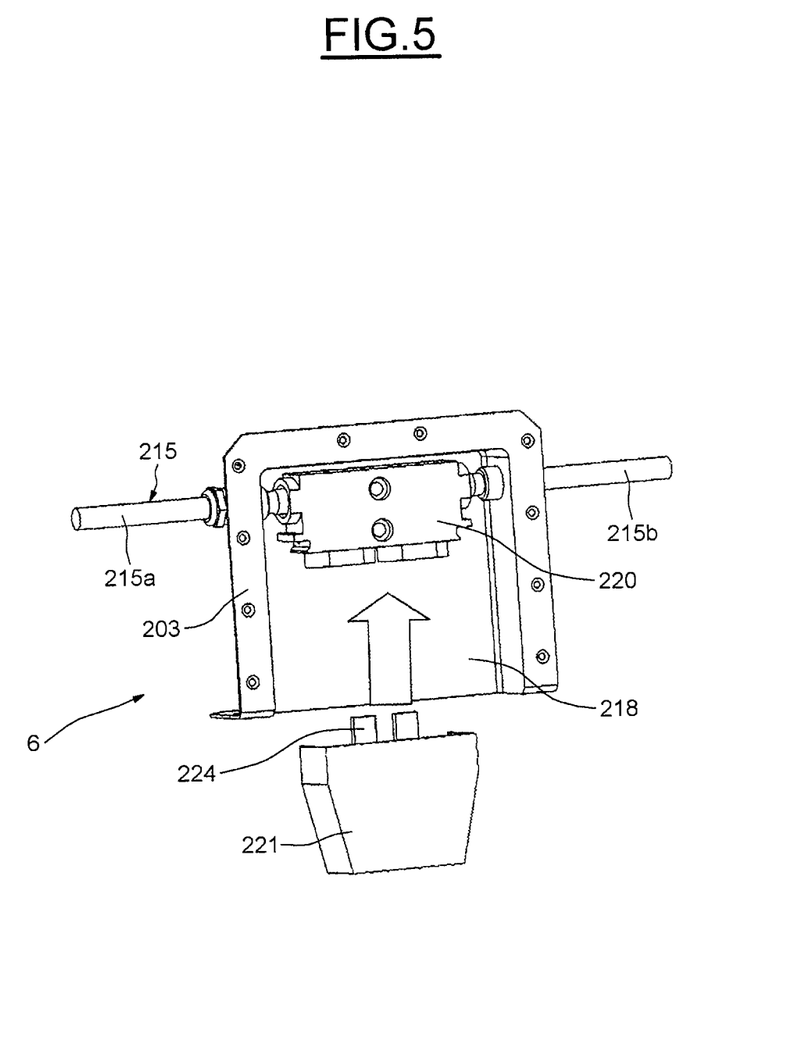
FIG. 5 shows a perspective view of a manually controlled isolator.

The base comprises two spaced electrical contact studs which are connected to an electrical cable 215. For this purpose, the electrical cable 215 comprises two portions 215a and 215b, the portion 215a being connected to the input of the connection device 3, i.e. to the terminal 2a of the battery 2, and to the first electrical contact stud. The portion 215b is connected to the second electrical contact stud and to the disconnection device 8.

The detachable component 221 carries a disconnection bar 224 which, when the component 221 is connected to the base 220, from the bottom upwards, is capable of electrically interconnecting the electrical contact studs of the base 220 in such a way that the output of the battery 2 is connected to the disconnection device 8 then to the relay device 9.

When the detachable component 221 is disconnected from the base 220, from the top downwards, the electrical contact studs of the base 220 are isolated in such a way that the output of the battery 2 is no longer connected to the disconnection device 8 and to the relay device 9, and is therefore isolated.

The external envelope 202 is provided with means for the purpose of its installation below a vehicle, which may comprise fixing lugs 225 fitted against the lateral wall of the support 203 and carefully distributed at its periphery.

By means of the manually controlled isolator 6, it is possible to isolate the battery when it is necessary to carry out work on the battery case 201, in particular during its installation in the vehicle or during its removal, or when work has to be carried out in a general manner on the electrical circuits of the vehicle.

In one alternative embodiment, a manually controlled isolator can also be provided on the electrical cable connecting the negative terminal of the battery 2 to the common negative terminal.

As described, the manually controlled isolator 6 is accessible from below the vehicle. In an alternative embodiment, the manually controlled isolator can be accessible from the inside of the vehicle, for example through an opening formed by a trapdoor.

Thus, by means of such a battery case, it is possible not only to detect a malfunction of the battery, but also to quickly disconnect the battery from the vehicle if the malfunction may damage the equipment.

Finally, the battery case also allows the safety of the persons working on the vehicle to be taken into account, notably by means of a manually controlled isolator which allows the electrical circuit of the battery to be opened before any maintenance or installation/removal work is carried out.

The invention claimed is:

1. A device for connection of a battery to an electric or hybrid motor vehicle, comprising at least one input adapted to be connected to a first terminal of the battery and at least one output adapted to be connected to a first terminal of an electrical circuit of the vehicle, wherein the device also comprises:
    a device for measuring the voltage between the first terminal of the battery and a reference potential;
    a control unit adapted to receive the voltage values measured by the voltage-measuring device adapted to determine an insulation resistance between the first terminal of the battery and the reference potential, and adapted for connecting or keeping connected the first terminal of the battery and the first terminal of the electrical circuit if said insulation resistance is greater than a determined threshold; and
    an electrical circuit disconnection device fitted in series between the input and the output of the connection device, the electrical circuit disconnection device being controlled by the control unit;
    wherein the disconnection device comprises a pyrotechnic igniter connected to control terminals, the electrical opening of the disconnection device being controlled by an electrical control signal applied to said control terminals.

2. The connection device according to claim 1, wherein the voltage-measuring device comprises:
    a measurement input,
    a resistor and a switch fitted in series between the measurement input and the reference potential, the switch being controlled by the control unit, and
    a voltmeter fitted in parallel with the resistor and the switch between the measurement input and the reference potential.

3. The connection device according to claim 1, also comprising a circuit-breaker fitted in series between the input and the output of the connection device, the circuit-breaker being controlled by the control unit and allowing the first terminal of the battery to be connected to the first terminal of the electrical circuit.

4. The connection device according to claim 1, also comprising a fuse fitted in series between the input and the output of the connection device.

5. The connection device according to claim 1, also comprising an electrical circuit disconnection device fitted in series between the input and the output of the connection device, the electrical circuit disconnection device being controlled by the control unit.

6. The connection device according to claim 5, wherein the disconnection device comprises a pyrotechnic igniter connected to control terminals, the electrical opening of the disconnection device being controlled by an electrical control signal applied to said control terminals.

7. A device for connection of a battery to an electric or hybrid motor vehicle, comprising at least one input adapted to be connected to a first terminal of the battery and at least one output adapted to be connected to a first terminal of an electrical circuit of the vehicle, wherein the device also comprises:
    a device for measuring the voltage between the first terminal of the battery and a reference potential;

a control unit adapted to receive the voltage values measured by the voltage-measuring device adapted to determine an insulation resistance between the first terminal of the battery and the reference potential, and adapted for connecting or keeping connected the first terminal of the battery and the first terminal of the electrical circuit if said insulation resistance is greater than a determined threshold; and a manually controlled isolator fitted in series between the input of the connection device and the input of the measurement device.

8. The connection device according to claim 7, wherein the manually controlled isolator comprises a base fitted with spaced electrical contact means and adapted to be connected to a detachable component provided with a disconnection bar in such a way that, after connection, the disconnection bar of the detachable component connects the electrical contact means of the base.

9. A device for connection of a battery to an electric or hybrid motor vehicle, comprising at least one input adapted to be connected to a first terminal of the battery and at least one output adapted to be connected to a first terminal of an electrical circuit of the vehicle, wherein the device also comprises:

a device for measuring the voltage between the first terminal of the battery and a reference potential;

a control unit adapted to receive the voltage values measured by the voltage-measuring device adapted to determine an insulation resistance between the first terminal of the battery and the reference potential, and adapted for connecting or keeping connected the first terminal of the battery and the first terminal of the electrical circuit if said insulation resistance is greater than a determined threshold; and a second input capable of being connected to a second terminal of the battery, a second output capable of being connected to a second terminal of the electrical circuit, and a second device for measuring the voltage between the second terminal of the battery and a reference potential, the control unit adapted to receive the voltage values measured by the second voltage-measuring device, adapted to determine an insulation resistance between the second terminal of the battery and the reference potential, and adapted for connecting or keeping connected the second terminal of the battery and the second terminal of the electrical circuit when said insulation resistance is greater than the determined threshold.

10. The connection device according to claim 9, also comprising a circuit-breaker and/or an electrical circuit disconnection device fitted in series between the second input and the second output of the connection device.

11. A battery case for an electric or hybrid vehicle, comprising a battery and a connection device according to claim 1.

* * * * *